United States Patent
Golshan et al.

(10) Patent No.: US 6,751,764 B1
(45) Date of Patent: Jun. 15, 2004

(54) METHOD AND APPARATUS FOR TESTING AND DEBUGGING A CIRCUIT

(75) Inventors: Farideh Golshan, Mountain View, CA (US); Sai Vishwanthaiah, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 498 days.

(21) Appl. No.: 09/909,742

(22) Filed: Jul. 19, 2001

(51) Int. Cl.[7] .............................................. G01R 31/28
(52) U.S. Cl. ...................................................... 714/729
(58) Field of Search ................................ 714/724, 725, 714/726, 727, 729; 324/763, 525, 729; 326/16

(56) References Cited

U.S. PATENT DOCUMENTS

| | | | | |
|---|---|---|---|---|
| 5,654,895 A | * | 8/1997 | Bach et al. .................. 702/65 |
| 5,812,562 A | * | 9/1998 | Baeg .......................... 714/726 |
| 6,060,907 A | | 5/2000 | Vishwanthaiah et al. ..... 326/87 |
| 6,185,711 B1 | * | 2/2001 | Leung et al. ................ 714/731 |
| 6,263,461 B1 | * | 7/2001 | Ayres et al. ................ 714/718 |
| 6,380,724 B1 | * | 4/2002 | Mahurin et al. ........... 324/73.1 |
| 6,446,229 B1 | * | 9/2002 | Merrick et al. ............. 714/724 |
| 6,654,917 B1 | * | 11/2003 | Floyd et al. ................ 714/726 |

* cited by examiner

*Primary Examiner*—Albert Decady
*Assistant Examiner*—Esaw Abraham
(74) *Attorney, Agent, or Firm*—Gunnison, McKay & Hodgson, L.L.P.; Philip J. McKay

(57) ABSTRACT

A series of secondary or "shadow" storage elements are employed that duplicate, or "shadow", the information in a circuit's core logic shadowed functional registers. These shadow storage elements are then coupled to form a separate, independently-addressable shadow scan path. The information contained in the shadowed functional registers of a circuit is then shifted out via the shadow scan path without altering the shadowed functional registers using special commands issued from a JTAG controller.

5 Claims, 11 Drawing Sheets

METHOD AND APPARATUS FOR TESTING AND DEBUGGING A CIRCUIT

FIELD OF THE INVENTION

The present invention relates generally to methods for circuit testing, and, more particularly, to methods and for circuit testing that allow the circuit to be debugged while the circuit continues to perform normal circuit operations in the microprocessor. The present invention also relates to a method for impedance controller circuit testing.

BACKGROUND OF THE INVENTION

Advances in technology, such as the development of complex circuits including integrated circuits (ICs) and microprocessors, particularly surface mounted ICs and microprocessors have made traditional circuit testing methods extremely difficult. One prior art approach for testing complex circuits was to employ: the Joint Test Action Group (JTAG) standard, which was developed by an international group of electronic manufacturers. The JTAG standard has been adopted by the Institute of Electrical and Electronic Engineers (IEEE) as IEEE Standard 1149.1–1990, IEEE Standard Test Access Port and Boundary-Scan Architecture (the "IEEE standard"), the contents of which are hereby incorporated in their entirety by reference.

In the prior art, the JTAG standard was typically used for boundary scan testing. Boundary scan testing allowed for testing based on a circuit's inputs and outputs, i.e., at the boundaries, but did not provide for testing of the core logic of a circuit or microprocessor.

The JTAG standard was occasionally used in the prior art to perform tests of the core logic of an IC. However, when the JTAG standard was used in the prior art to perform these tests, the tests were invasive because data was entered or outputted serially from one storage element to another. When the test data was entered or outputted serially from one storage element to another using prior art methods, the data originally contained in those storage elements was altered by the process. As a result, prior art testing of core logic using the JTAG standard typically required that the circuit, IC or microprocessor be taken out of normal operation within a system and run in a special test mode. These prior art methods resulted in the circuit not being tested during normal operation. Consequently, the data received did not test the circuit during actual system operation.

What is needed is a method that allows for circuit debug while the circuit, IC or microprocessor remains on-line and continues to perform normal circuit operations. In addition, there is a particular need for a method for testing impedance controller circuits.

SUMMARY OF THE INVENTION

In one embodiment of the invention, a method for testing a circuit having at least one functional unit includes providing the functional unit with a primary scan path and providing the functional unit with a shadow scan path. Data contained in the primary scan path is shifted into the shadow scan path. The data in the shadow scan path is then shifted out of the functional unit for testing the operation of the circuit while the circuit continues its normal operations.

Thus, in accordance with the present invention, a series of secondary or "shadow" storage elements that duplicate, or "shadow", the information in the core logic's primary storage elements are employed. These shadow storage elements are then connected together to form a separate, independently-addressable scan path (the secondary or "shadow" scan path). The information contained in the primary storage elements is then shifted out via the shadow scan path without altering the primary storage elements using special commands issued from a JTAG controller. This shadow scan system allows a circuit to remain operational while a snapshot of the core logic information is shifted out.

As discussed in more detail below, the method of the present invention allows for access to the internal states of the microprocessor while the microprocessor continues to operate in a system. This is accomplished by capturing the contents of the functional primary storage elements into the shadow storage elements and then shifting the captured value out of the microprocessor without interrupting normal circuit operation. This is in direct contrast to prior art methods which either tested only at the boundaries, i.e., at the inputs and outputs of the circuit, or that required the microprocessor to be run in a special test mode. In addition, using the method of the invention, real operating data is obtained from the microprocessor. This again is in direct contrast to the prior art methods where only data from special test mode operations could be obtained.

The method of the present invention uses the JTAG standard and takes advantage of the separate JTAG clock (TCK) to manipulate the capture and shift operations of the shadow scan path using specially designed JTAG signals. In addition, using the method of the invention, the shadow scan paths are not part of the microprocessor internal scan chain.

In one embodiment of the invention, the functional unit is an impedance controller circuit, such as the impendence controller described in U.S. Pat. No. 6,060,907. In this embodiment of the invention, a circuit includes at least one impedance controller circuit. The impedance controller circuit includes a primary scan path and a shadow scan path. The shadow scan path receives data contained in the primary scan path and shifts the data out of the impedance controller circuit for testing and observing the operation of the impedance controller circuit while the impedance controller circuit continues its normal operations. In one embodiment of the invention, known data is also written back into the impedance controller circuit via the shadow scan path while the values in the functional scan path remain variable. In another embodiment of the invention, known data is written back into the impedance controller circuit via the shadow scan path while the values in the functional scan path are held constant or are "frozen".

It is to be understood that both the foregoing general description and following detailed description are intended only to exemplify and explain the invention as claimed.

BRIEF DESCRIPTION OF THE DRAWINGS

The accompanying drawings, which are incorporated in, and constitute a part of this specification, illustrate embodiments of the invention and, together with the description, serve to explain the advantages and principles of the invention. In the drawings.

DETAILED DESCRIPTION

The invention will now be described in reference to the accompanying drawings. The same reference numbers may be used throughout the drawings and the following description to refer to the same or like parts.

Figure 1A:
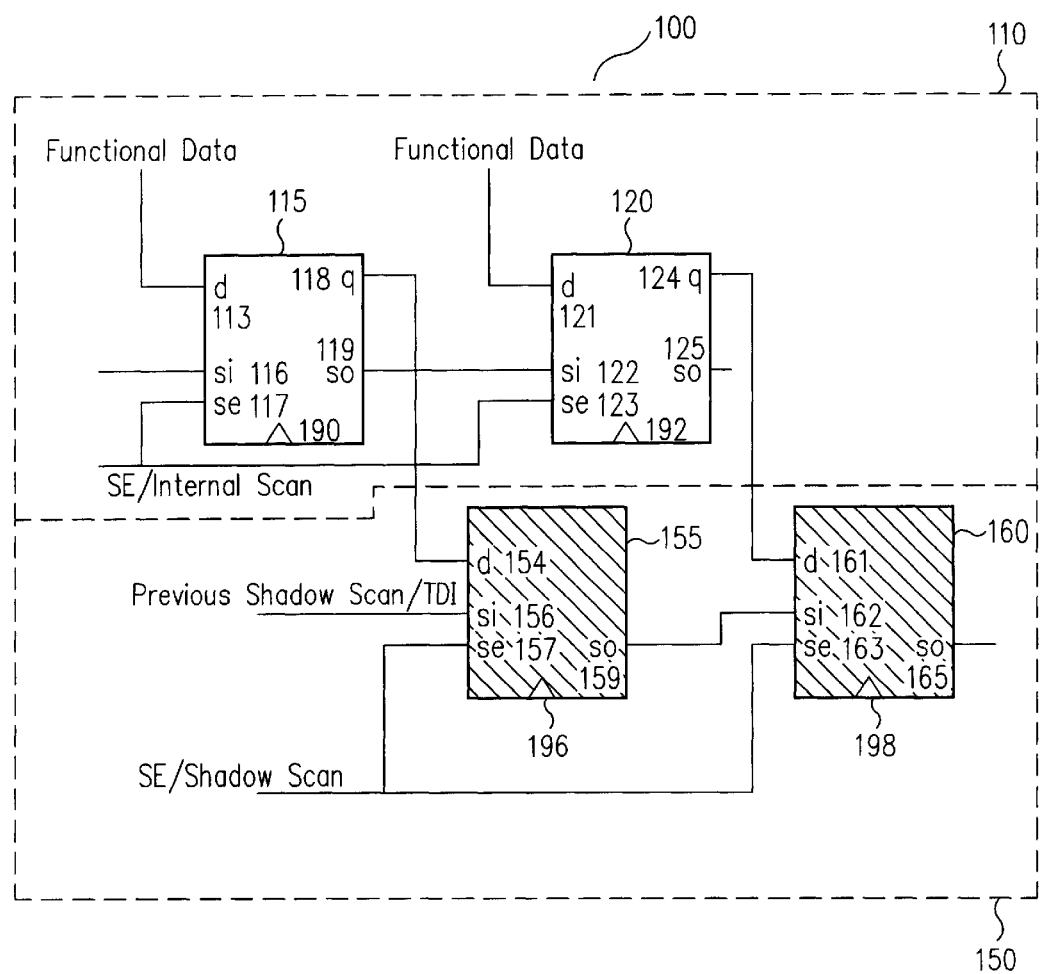
FIG. 1A shows a simplified diagram of a shadow scan configuration in accordance with the method of the present invention.

FIG. 1A shows a simplified diagram of a shadow scan configuration 100 in accordance with the present invention including the important connections between elements. Primary storage elements 115 and 120 receive functional data at their respective "d" inputs 113 and 121. The "q" outputs 118 and 124 of primary storage elements 115 and 120, respectively, are coupled to the "d" inputs 154 and 161 of secondary or "shadow" storage elements 155 and 160, respectively. In one embodiment of the invention, the Scan Out (so) output 119 of primary storage element 115 is coupled to the Scan In (si) input 122 of primary storage element 120 to form primary scan path 110. Likewise, the "so" output 159 of shadow storage element 155 is coupled to the "si" input 162 of shadow storage element 160 to form a secondary or "shadow" scan path 150.

In one embodiment of the invention, primary storage elements 115 and 120 are edge-triggered flip-flops with a data input ("d") and a clock input ("CK"), such as D-type flip-flops and shadow storage elements 155 and 160 are edge-triggered flip-flops with two data inputs, a Select ("se") input, a clock-enable ("CE") input, and a clock input ("CK"), such as mux-2 D-type flip flops with clock enable. Shadow storage elements 155, 160 receive data from primary storage elements 115, 120 via the "d" inputs 154 and 161, respectively, and receive data from preceding shadow storage elements via the si inputs 156, 162, respectively.

For simplicity, in FIG. 1A, only two primary storage elements 115 and 120 are shown and only two shadow storage elements 155 and 160 are shown. In actual practice there could be any number of primary storage elements 115 and 120 and shadow storage elements 155 and 160 that a given application of the invention required. In one embodiment of the invention, all the primary storage elements 115 and 120 are substantially connected as shown in FIG. 1A to form a primary scan path 110 and all the shadow storage elements 155 and 160 are substantially connected as shown in FIG. 1A to form a shadow scan path 150, regardless of the number of elements employed.

Typically, primary scan path 110 includes more than two storage elements 115 and 120 and shadow scan path 150 includes more than two shadow storage elements 155 and 160. Consequently, primary storage element 115 includes a "si" input 116 for coupling to a preceding primary storage element (not shown) and primary storage element 120 includes a "so" output 125 for coupling to a following primary storage element (not shown). Likewise, shadow storage element 155 includes a "si" input 156 for coupling to a preceding shadow storage element (not shown) and shadow storage element 160 includes a "so" output 165 for coupling to a following shadow storage element (not shown).

In addition to the elements discussed above, primary storage elements 115 and 120 include Scan Enable (se) inputs 117 and 123, respectively, and CLK inputs 190 and 192, respectively. Likewise, shadow storage elements 155 and 160 include "se" inputs 157 and 163, respectively, and CLK inputs 196 and 198, respectively.

The signals received at se inputs 157 and 163 are, according to the invention, special signals generated by a JTAG controller 130 (FIG. 1B) which control the data out of primary storage elements 115 and 120 and into shadow storage elements 155 and 160. The signals generated on se inputs 157 and 163, as well as the clock generating the signal on CLK inputs 196 and 198 are discussed in more detail below.

Figure 1B:
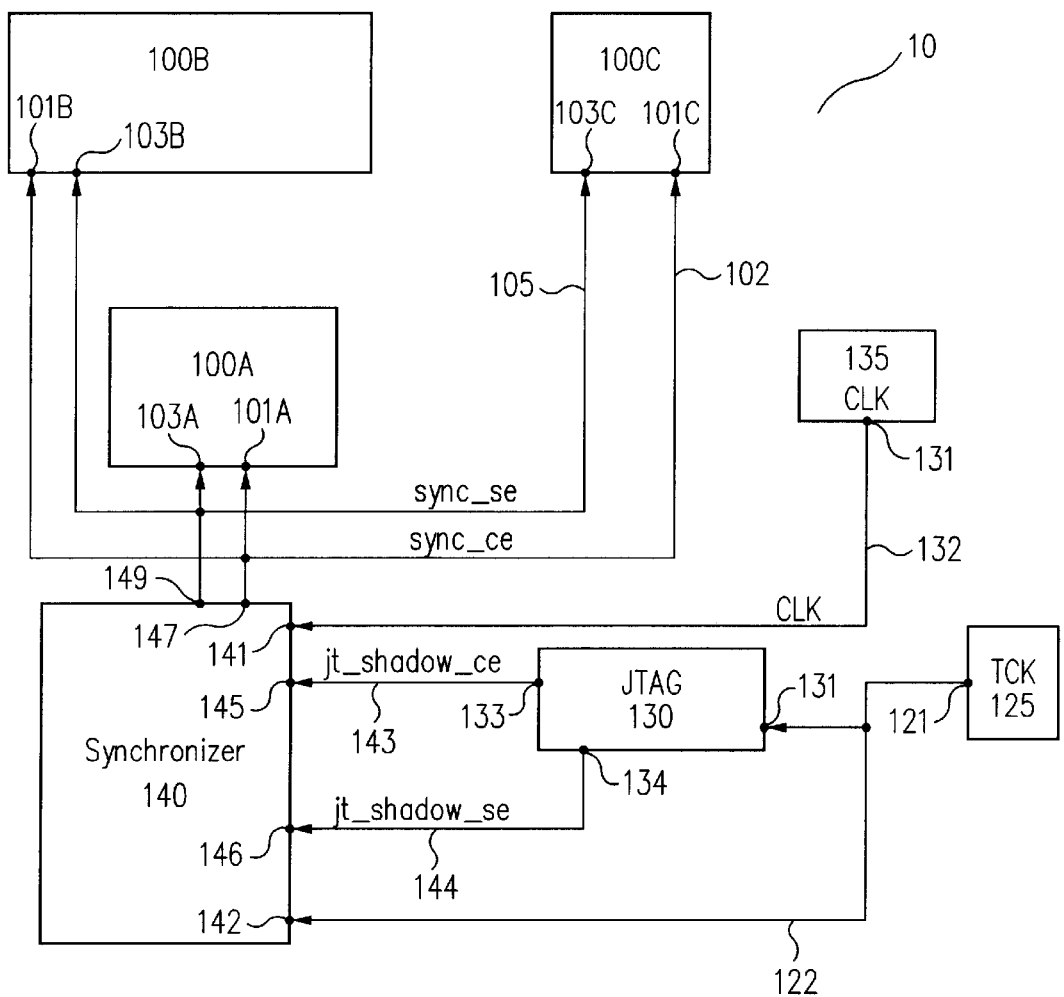
FIG. 1B is a block diagram of a system consistent with the method of the present invention.

In accordance with the present invention, shadow storage elements 155 and 160 duplicate or "shadow" the information in the core logic's primary storage elements 115 and 120. As discussed above, shadow storage elements 155 and 160 are then coupled together with so output 159 connected to si input 162 to form a separate, independently-addressable shadow scan path 150. The information contained in primary storage elements 115 and 120 is then shifted out via the shadow scan path 150 without altering primary storage elements 115 and 120 in primary scan path 110. According to the invention, and in contrast to the prior art methods discussed above, this is done without interrupting, or in any way disturbing, the normal circuit operation of primary storage elements 115 and 120 using special commands issued by JTAG controller 130 (FIG. 1B). Thus, the shadow scan system of the invention allows a circuit to remain operational while a snapshot of the core logic information is shifted out.

As discussed above, and in more detail below, the method of the present invention allows for access to the internal states of the microprocessor while the microprocessor continues to operate in a system. This is accomplished by capturing the contents of the functional primary storage elements 115, 120 into the shadow storage elements 155, 160 and then shifting the captured value out of the microprocessor without interrupting normal circuit operation. This is in direct contrast to prior art methods which either tested only at the boundaries, i.e., at the inputs and outputs of the circuit, or that required the microprocessor to be run in a special test mode. In addition, using the method of the invention, real operating data is obtained from the microprocessor or circuit. This is also in direct contrast to the prior art methods where only data from special test mode operations could be obtained. Consequently, using the method of the invention, more accurate and realistic test data is provided.

The method of the present invention uses the JTAG standard and takes advantage of the separate JTAG clock (TCK) to manipulate the capture and shift operations of the shadow scan path 150 using specially designed JTAG signals.

FIG. 1B is a block diagram of a system 10 consistent with the present invention. System 10 includes: a system or central processing unit "CPU" clock, referred to herein as "CLK 135"; a JTAG clock, referred to herein as "TCK 125"; a JTAG controller 130; a block of one or more synchronizer circuits, referred to herein as "synchronizer 140"; and functional units 100A, 100B and 100C.

As shown in FIG. 1B, CLK 135 has an output terminal 131 coupled to CLK input terminal 141 of synchronizer 140 by line 132. TCK 125 has an output terminal 121 coupled to input terminal 131 of JTAG controller 130 by line 122 and input terminal 142 of synchronizer 140 by line 122.

In addition, according to the invention, JTAG controller 130 has a shadow_ce output terminal 133 coupled to a shadow_ce input terminal 145 of synchronizer 140 by line 143. According to the invention, JTAG controller 130 also has a shadow_se output terminal 134 coupled to a shadow_se input terminal 146 of synchronizer 140 by line 144. JTAG controller shadow_ce output terminal 133, synchronizer shadow_ce input terminal 145, JTAG controller shadow_se output terminal 134, synchronizer shadow_se input terminal 146, as well as the signals jt_shadow_ce and jt_shadow_se generated on lines 143 and 144, will be discussed in more detail below.

As also shown in FIG. 1B, synchronizer 140 includes a sync_ce output terminal 147 and a sync_se output terminal 149. Synchronizer 140 sync_ce output terminal 147 is coupled to: sync_ce input terminal 101A of functional unit 100A; sync_ce input terminal 101B of functional unit 100B; and sync_ce input terminal 101C of functional unit 100C by line 102. Synchronizer 140 sync_se output terminal 149 is coupled to: sync_se input terminal 103A of functional unit 100A; sync_se input terminal 103B of functional unit 100B; and sync_se input terminal 103C of functional unit 100C by line 105. Synchronizer sync_ce output terminal 147, synchronizer sync_se output terminal 149, as well as signals sync_ce and sync_se on lines 102 and 105 are discussed in more detail below.

Functional units 100A, 100B and 100C are representative of any functional units used in microprocessors and well known to those of skill in the art. In one embodiment of the invention, functional units 100A, 100B and 100C are instruction units (IUs). In another embodiment of the invention, functional units 100A, 100B and 100C are external memory units (EMUs). In another embodiment of the invention, functional units 100A, 100B and 100C are arithmetic logic units (ALUs) or floating-point units (FPUs). In yet another embodiment of the invention, functional units 100A, 100B and 100C are a mix of IUs, EMUs, ALUs and/or FPUs. It should also be noted here that for simplicity only three functional units 100A, 100B, 100C are shown in FIG. 1B. However, those of skill in the art will recognize that any number of functional units desired can be accommodated using the method and structure of the invention.

In addition, as discussed in more detail below, in one embodiment of the invention, functional units 100A, 100B and 100C are impedance controller circuits.

CLK 135 is one of numerous system clocks well known in the art that can have virtually infinite frequencies ranging, at the time of this application, from megahertz to gigahertz. As mentioned, system clocks such as CLK 135 are well known in the art and therefore will not be discussed in further detail in order to avoid detracting from the present invention.

TCK 125 is the external clock required by the JTAG standard and well known to those of skill in the art. TCK 125 typically operates at a frequency that is much lower than CLK 135. For instance, as one example, CLK 135 may operate at a frequency of one gigahertz while TCK 125 operates at a frequency of ten megahertz. As with CLK 135, TCK 125 is well known in the art and therefore will not be discussed in further detail in order to avoid detracting from the present invention.

JTAG controller 130 is well defined in the JTAG standard and preferably issues commands to either primary storage elements 115, 120 (FIG. 1A) or shadow storage elements 155, 160 of functional units 100A, 100B and 100C via synchronizer:140. (FIG. 1B). These commands may include a Scan In (si) signal, a scan enable (se) signal, or a clock-enable (ce) signal, respectively, that are activated by issuing instructions designed specifically for these operations.

In addition, according to the present invention, JTAG controller 130 issues customized command signals, jt_shadow_ce and jt_shadow_se, to shadow storage elements 155, 160 of functional units 100A, 100B and 100C through synchronizer 140 (FIG. 1B).

JTAG controller 130 and its normal operation is well known to those of skill in the art and therefore will not be discussed in further detail herein order to avoid detracting from the present invention. Special command signals jt_shadow_ce and jt_shadow_se, associated with the present invention, will be discussed in more detail below.

As discussed above, CLK 135 and TCK 125 operate at different frequencies and often this difference in frequency is an order of magnitude or more. This creates two significant problems. First, the core logic's primary storage elements 115, 120 (FIG. 1A) are driven by CLK 135 whose signal is not synchronized with the signal from TCK 125. As discussed above, CLK 135 typically operates at a much higher speed than does TCK 125. If the signals from the two clocks, CLK 135 and TCK 125, are not synchronized, the shadow scan path 150 (FIG. 1A) of the present invention will not work and there is a chance that the circuit or microprocessor may be damaged. Second, TCK 125 is not skew-controlled, which could result in races and meta-stability between the shadow storage elements 155, 160 (FIG. 1A) of the present invention.

There exists, therefore, a need to synchronize the external clock signal from TCK 125 used to drive shadow storage elements 155, 160 with the system clock signal from CLK 135 used by the circuit's primary storage elements 115, 120, and to control skewing of the external clock signal from TCK 125.

This function is performed by Synchronizer 140 in FIG. 1B. In one embodiment of the invention, synchronizer 140 is of the type set forth in the commonly assigned patent application Ser. No. 09/204,557 of Arthur T. Leung and Dale Greenley entitled "METHODS AND APPARATUS FOR SYNCHRONIZING ASYNCHRONOUS TEST STRUCTURES AND ELIMINATING CLOCK SKEW CONSIDERATIONS" filed Dec. 3, 1998 which is incorporated herein, in it's entirety, by reference (hereinafter referred to as the Leung reference).

Methods and apparatus consistent with the Leung reference provide a way to drive a shadow storage element at an external clock rate that is synchronized with the system clock and that does not suffer from clock skew problems. Clock skew problems are eliminated by using the skew-controlled system clock CLK signal as the clock input of the shadow storage element. This obviates the need for a separate, skew-controlled JTAG TCK signal. Furthermore, the shadow storage element is synchronized with the system clock signal from,CLK 135 and operates at the frequency of the JTAG TCK signal.

More specifically, in one embodiment of the invention, synchronizer 140 receives a signal from TCK 125 at TCK input 142 and then yields output signals sync_se and sync_ce at outputs 149 and 147, respectively, that are synchronized with the system clock CLK 135, but operate at the frequency of the external signal from TCK 125. As discussed in more detail below with respect to FIG.2, in one embodiment of the invention, the sync_ce signal from synchronizer 140 is coupled to a shadow staging element, and the clock enable (ce) inputs of shadow storage elements 155 and 160. The system clock signal from CLK 135 is then coupled into the clock inputs 196 and 198 of shadow storage elements 155 and 160 (See FIG. 2). Since the clock-enable signal triggers shadow storage elements 155 and 160, shadow storage elements 155 and 160 are driven at the external signal frequency from TCK 125. Clock skew is thus eliminated because the system clock CLK 135 used for the clock input to the primary and shadow storage elements 115, 120, 155 and 160 is skew-controlled.

Figure 2:
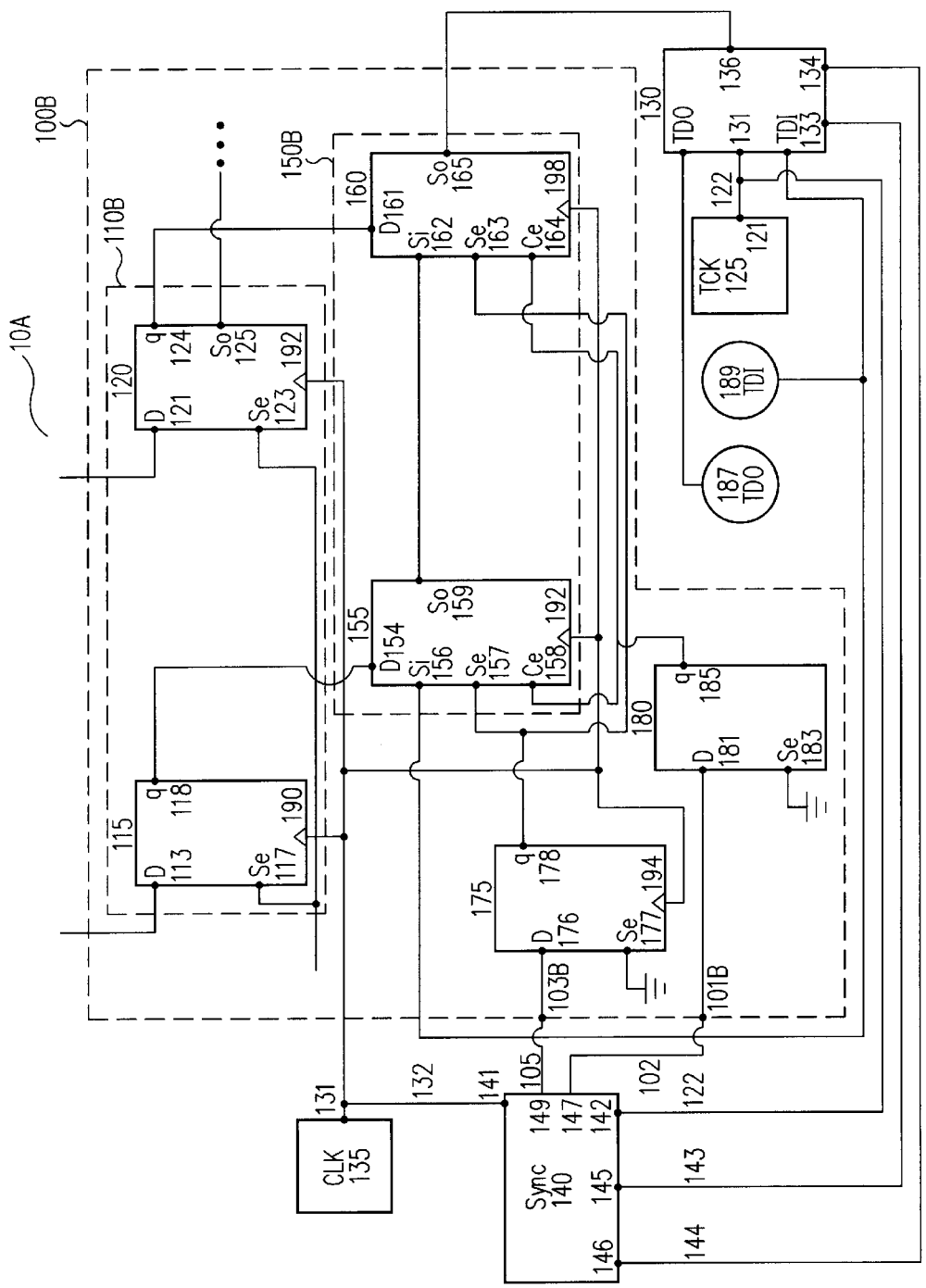
FIG. 2 is a block diagram depicting a system consistent with the method of the invention, similar to the system of FIG. 1B, in more detail.

FIG. 2 is a block diagram depicting a system 10A that is consistent with the invention and the Leung reference.

System 10A comprises: exemplary functional unit 100B from FIG. 1B with primary scan path 110B and a shadow scan path 150B; synchronizer 140; CLK 135; TCK 125; Test Data In (TDI) unit 189; Test Data Out (TDO) unit 187 and JTAG controller 130. In one embodiment of the invention, primary scan path 110B of functional unit 100B comprises primary storage elements 115 and 120 and shadow scan path 150B of functional unit 100B comprises shadow storage elements 155 and 160, as well as shadow staging elements 175 and 180. As with system 10 in FIG. 1B, system 10A is interfaced to CLK 135 and JTAG controller 130.

In the following discussion, functional unit 100B of FIG. 1B was chosen to discuss. However, those of skill in the art will recognize that functional units 100A or 100C of FIG. 1B, or any functional unit, could have been chosen for discussion. Functional unit 100B was simply chosen as an exemplary functional unit and the implementation of the invention in any other function unit would be substantially the same as discussed below.

As discussed above with regard to FIG. 1A, primary storage elements 115 and 120 store data used by the circuit core logic and shadow storage elements 155 and 160 store data either from primary storage elements 155, 120 or from a preceding shadow storage element in the chain. In one embodiment of the invention, primary storage elements 115 and 120 are edge-triggered flip-flops with a data input ("d") and a clock input ("CK"), such as D-type flip-flops. In one embodiment of the invention, shadow storage elements 155 and 160 are edge-triggered flip-flops with two data inputs, a Select ("se") input, a clock-enable ("CE") input, and a clock input ("CK"), such as mux-2 D-type flip flops with clock enable.

As also discussed above with respect to FIG. 1A, shadow storage elements 155, 160 receive data from primary storage elements 115, 120 via "d" inputs 154 and 161, respectively, and receive data from preceding shadow storage elements via "si" inputs 156 and 162.

In one embodiment of the invention, terminal TDI of JTAG controller 130 is connected to Test Data In unit 189 and si input 156 of shadow storage element 155. Terminal TDO of JTAG controller 130 is connected to Test Data Out unit 187. As in the embodiment of the invention discussed above with respect to FIG. 1B, JTAG controller 130 has a shadow_ce output terminal 133 coupled to a shadow_ce input terminal 145 of synchronizer 140 by line 143. JTAG controller 130 also has a shadow_se output terminal 134 coupled to a shadow_se input terminal 146 of synchronizer 140 by line 144.

Synchronizer 140 includes a sync_ce output terminal 147 and a sync_se output terminal 149. Synchronizer 140 sync_ce output terminal 147 is coupled to sync_ce input terminal 101B of functional unit 100B by line 102. In one embodiment of the invention, input terminal 101B of functional unit 100B is coupled to "d" input terminal. 181 of shadow staging element 180. Synchronizer 140 sync_se output terminal 149 is coupled to sync_se input terminal 103B of functional unit 100B by line 105. In one embodiment of the invention, input terminal 103B of functional unit 100B is coupled to "d" input terminal 176 of shadow staging element 175.

As also shown in FIG. 2, in one embodiment of the invention, CLK 135 has an output terminal 131 coupled to CLK input terminal 141 of synchronizer 140 by line 132. TCK 125 has an output terminal 121 coupled to input terminal 131 of JTAG controller 130 by line 122 and input terminal 142 of synchronizer 140 by line 122.

In one embodiment of the invention, the "d" inputs 154 and 161 of shadow storage elements 155 and 160, respectively, are coupled to the "g" data outputs 118 and 124 of primary storage elements 115 and 120, respectively, and the "si" input 162 of shadow storage element 160 is coupled to the "so" data output 159 of shadow storage element 155 to form shadow scan path 150B. The "so" data output of the last shadow storage element in shadow scan path 150, i.e., output 165 of shadow storage element 160 in FIG. 2, is coupled to JTAG controller 130 at terminal 136.

In one embodiment of the invention, CLK 135 is coupled to the clock inputs 190 and 192 of primary storage elements 115 and 120, respectively, and clock inputs 196 and 198 of shadow storage elements 155 and 160, respectively.

In one embodiment of the invention, a "g" output terminal 178 of shadow staging element 175 is coupled to the se input terminal 157 of shadow storage element 155 and se input terminal 163 of shadow storage element 160. A "q" output terminal 185 of shadow staging element 180 is coupled to the ce input terminal 158 of shadow storage element 155 and ce input terminal 164 of shadow storage element 160.

As discussed above, JTAG controller 130 is well defined in the JTAG standard and issues commands to either primary storage elements 115, 120 or shadow storage elements 155, 160 via synchronizer 140. These commands include a Scan In (si) signal, a Select Enable (se) signal, or a Clock Enable (ce) signal, respectively.

In addition, according to the present invention, special customized command signals jt_shadow_ce and jt_shadow_se are generated by JTAG controller 130. As discussed above, signal jt_shadow_ce is coupled from output terminal 133 of JTAG controller 130 to input terminal 145 of synchronizer 140 by line 143 and signal jt_shadow_se is coupled from output terminal 134 of JTAG controller 130 to input terminal 146 of synchronizer 140 by line 144. Signals sync_se and sync_ce are then generated by synchronizer 140 at output terminals 149 and 147, respectively.

As discussed above, in one embodiment of the invention, output terminal 147 from synchronizer 140 is coupled to the data "d" input 181 of shadow staging element 180 and output terminal 149 from synchronizer 140 is coupled to the data "d" input 176 of shadow staging element 175.

As discussed above, CLK 135 outputs a skew-controlled clock signal that is used by many components of the system, such as the logic elements of the core logic. Synchronizer 140 receives inputs from CLK 135 and JTAG controller 130, and provides output signals sync_se and sync_ce that are synchronized to CLK 135 and operate at the frequency of the signal from JTAG controller 130.

Figure 3:
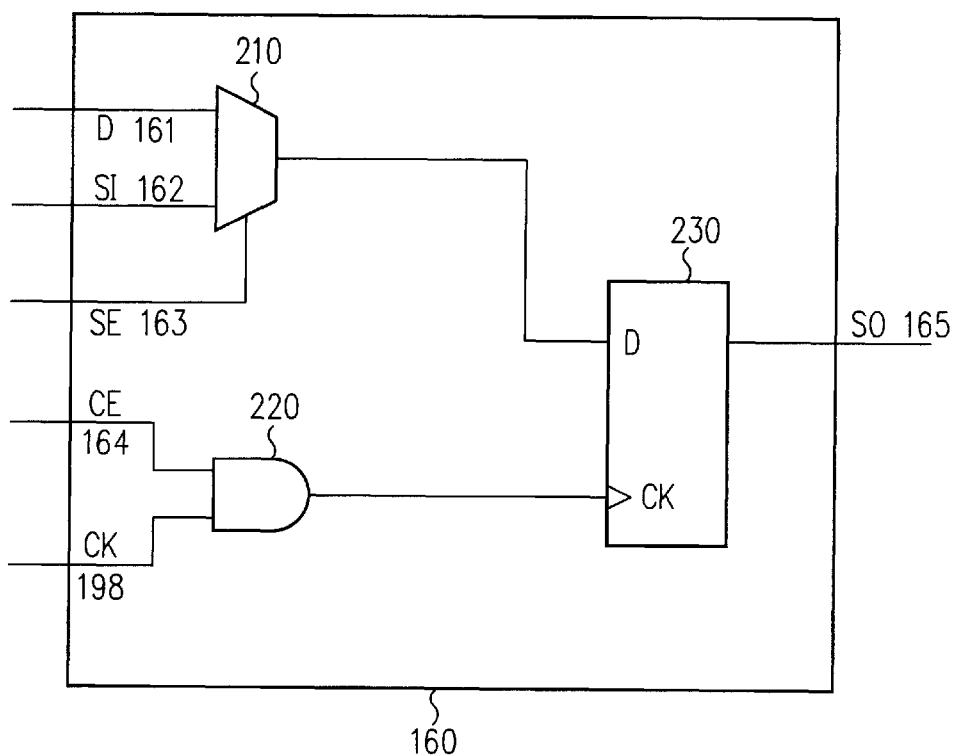
FIG. 3 is a block diagram depicting a detailed view of one implementation of shadow storage element.

FIG. 3 is a block diagram depicting a detailed view of one implementation of shadow storage element 160 suitable for use with the present invention. In the following discussion, shadow storage element 160 of FIG. 1A and FIG. 2 was chosen to discuss. However, those of skill in the art will recognize that shadow storage element 155 of FIG. 1A and FIG. 2, or any shadow storage element, could have been chosen for discussion. Shadow storage element 160 was simply chosen as an exemplary shadow storage element and the implementation of the invention in any other shadow storage element would be substantially the same as discussed below.

In one embodiment of the invention, shadow storage element 160 is an edge-triggered flip flop with clock enable, such as a mux-2 flip-flop with clock enable. In one embodiment of the invention, shadow storage element 160 preferably contains a multiplexor 210, an AND gate 220, and a D-type flip-flop 230.

Multiplexor 210 has a "d" input coupled to "d" input terminal 161, a "si" input coupled to "si" input terminal 162, a "se" input coupled to "se" input terminal 163, and a "so" output coupled to "so" output terminal 165. Flip-flop 230 has a D input connected to the output of multiplexor 210, a clock input, and an output. AND gate 220 has first and second inputs, and an output connected to the clock input of flip-flop 230.

In one embodiment of the invention, Multiplexor 210 is used to select, as an input to flip-flop 230, either data from a primary storage element (e.g., from primary storage element 115 in FIG. 1A and FIG. 2) or data from a preceding shadow storage element in shadow scan path 150 (e.g., from shadow storage element 155 in FIG. 1A and FIG. 2).

Figure 4:
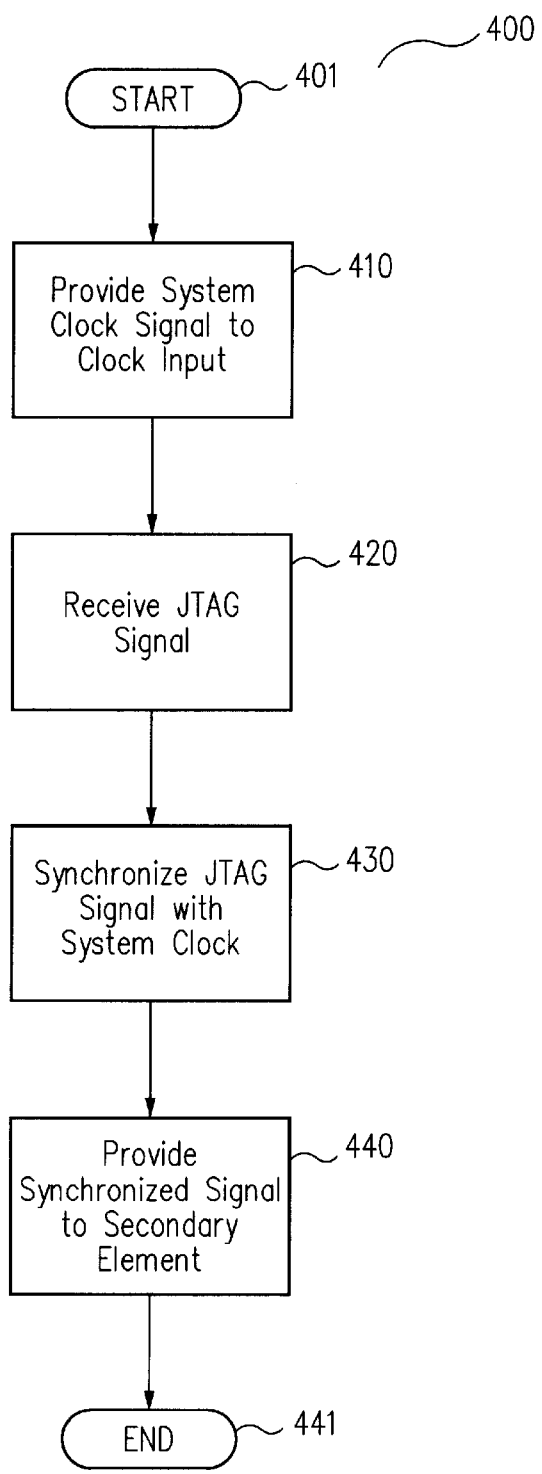
FIG. 4 is a flow diagram of a method of synchronizing an external clock TCK to a system clock CLK and controlling skew associated with the external clock in accordance with one embodiment of the method of the invention.

FIG. 4 is a flow diagram of a method 400 for synchronizing the JTAG clock TCK to system clock CLK and controlling skew associated with TCK. FIG. 4 is described with reference to system 10A shown in FIG. 2.

The process begins at step 401. At step 410, the system clock signal from CLK 135, which is skew-controlled, is provided to clock inputs 196, 198, respectively, of shadow storage elements 155 and 160.

At step 420, JTAG controller 130 generates a signal. The signal may be, for example, a signal to scan in data to the first shadow storage element in the chain, a signal to sample data from a preceding shadow storage element, or a signal to enable a shadow storage element.

At step 430, system 10A synchronizes the signal from JTAG controller 130 with CLK 135 by using synchronizer 140. In one embodiment of the invention, if the signal from JTAG controller 130 is signal jt_shadow_ce or jt_shadow_se, system 10A synchronizes the signal with system clock signal from CLK 135 by using synchronizer 140.

At step 440, the synchronized signal output from synchronizer 140 is provided as an input to a shadow storage element, such as shadow storage elements 155, 160. If the synchronized signal from JTAG controller 130 is signal sync_se, the signal is provided to the se inputs 157, 163 of shadow storage elements 155, 160, respectively. If the synchronized signal from JTAG controller 130 is signal sync_ce, the signal is provided to the ce inputs 158, 164 of shadow storage elements 155, 160, respectively. At step 441 the process ends.

The process described above with reference to FIG. 4 and FIG. 2 eliminates clock skew by using the skew-controlled system clock CLK 135 signal as the clock input 196, 198 of shadow storage elements 155 and 160, respectively (FIG. 2). This obviates the need for a separate, skew-controlled TCK 125 or JTAG signal. Furthermore, the process described above synchronizes shadow storage elements 155 and 160 with the system clock signal from CLK 135 and operates at the frequency of the TCK 125 or JTAG signal.

Using the Leung reference's implementation of the synchronizer 140 with system 10 of FIG. 1B and system 10A of FIG. 2, JTAG controller 130 asserts a signal jt_shadow_ce for one TCK 125 cycle on line 143 to input 145 of synchronizer 140 (FIG. 1B). Synchronizer 140 then takes the TCK 125 domain signal and generates a sync_ce pulse for one cycle of CLK 135 at output 147 on line 102. The sync_ce pulse enables the functional data at the "d" inputs 113 and 121 of primary storage elements 115 and 120, respectively, to be sampled by shadow storage elements 155 and 160 at inputs 154 and 161, respectively (FIG. 2). JTAG controller 130 then asserts a signal jt_shadow_se and holds this signal high or at a digital one "1" during the shift operation. In an operation similar to the jt_shadow_ce discussion above, the jt_shadow_se signal is asserted for one TCK 125 cycle on line 144 to input 146 of synchronizer 140 (FIG. 1B). Synchronizer 140 then takes the TCK 125 domain signal and generates a sync_se pulse for one cycle of CLK 135 at output 149 on line 105.

Figure 5:
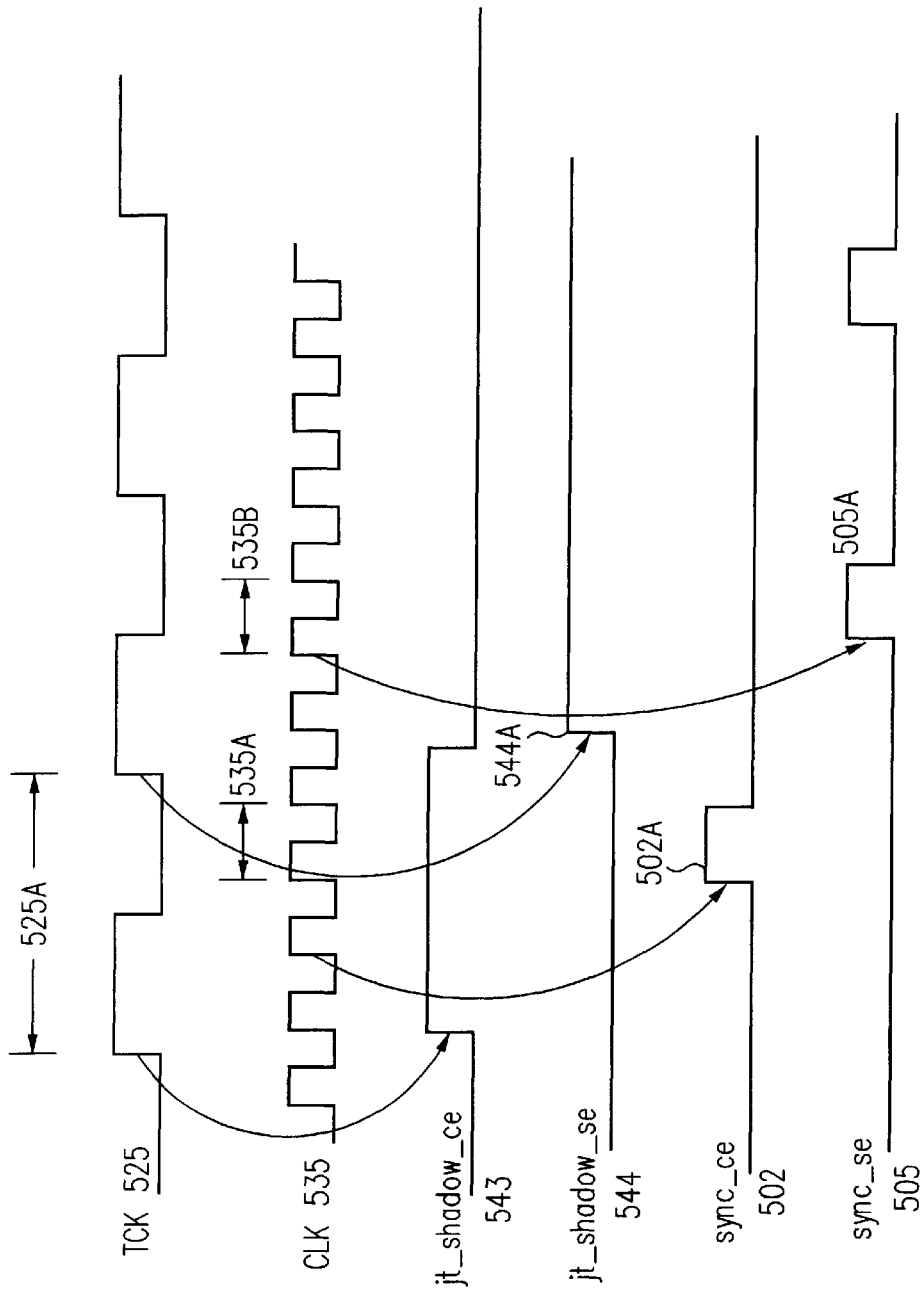
FIG. 5 is a timing diagram depicting signals associated with the system of FIG. 1B and FIG. 2 in accordance with the principles of the method of the invention.

FIG. 5 is a timing diagram depicting the signals associated with system 10 of FIG. 1B and system 10A of FIG. 2 in accordance with the principles of the invention. FIG. 5 shows: signal TCK 525 from TCK 125 in FIGS. 1B and 2; signal CLK 535 from CLK 135 in FIGS. 1B and 2; signal jt_shadow_ce 543 from terminal 133 of JTAG controller 130 in FIGS. 1B and 2; signal jt_shadow_se 544 from terminal 134 of JTAG controller 130 in FIGS. 1B and 2; signal sync_ce 502 from terminal 147 of synchronizer 140 in FIGS. 1B and 2; and signal sync_se 505 from terminal 149 of synchronizer 140 in FIGS. 1B and 2.

As discussed above, using synchronizer 140 with system 10 of FIG. 1B and system 10A of FIG. 2A, JTAG controller 130 asserts a signal jt_shadow_ce 543 for one cycle 525A of signal TCK 525 from TCK 125. Synchronizer 140 then takes the signal jt_shadow_ce 543 and generates a sync_ce pulse 502A for one cycle 535A of signal CLK 535 from CLK 135. Sync_ce pulse 502A enables the functional data at the "q" outputs 118 and 124, i.e., the "d" inputs 113 and 121 of primary storage elements 115 and 120 of the previous clock cycle, respectively, to be sampled by shadow storage elements 155 and 160 at inputs 154 and 161, respectively (FIG. 2). JTAG controller 130 then drives signal jt_shadow_se 544 (FIG. 5) to high 544A and holds jt_shadow_se 544 at high 544A during the shift operation.

In an operation similar to the signal jt_shadow_ce 543 discussion above, signal jt_shadow_se is asserted on line 144 to input 146 of synchronizer 140 (FIGS. 1B and 2). Synchronizer 140 then generates a sync_se pulse 505A for one cycle 535B of signal CLK 535 from CLK 135.

Some embodiments of the invention are used with impedance controller circuits. Impedance controller circuits are circuits designed to adjust the impedance of processor interfaces to accommodate process variations, voltage and temperature variations and other environmental factors effecting system operation. Impedance controller circuits often operate extremely quickly and are extremely dynamic with virtually no defined static state. However, for test and debug purposes, it is often desirable to insert known values into the impedance controller circuit and, in some instances, hold the values in the impedance controller circuit shadowed functional registers at constant or known values. The method of the invention, as discussed above and below, is particularly well suited for this task.

Figure 6A:
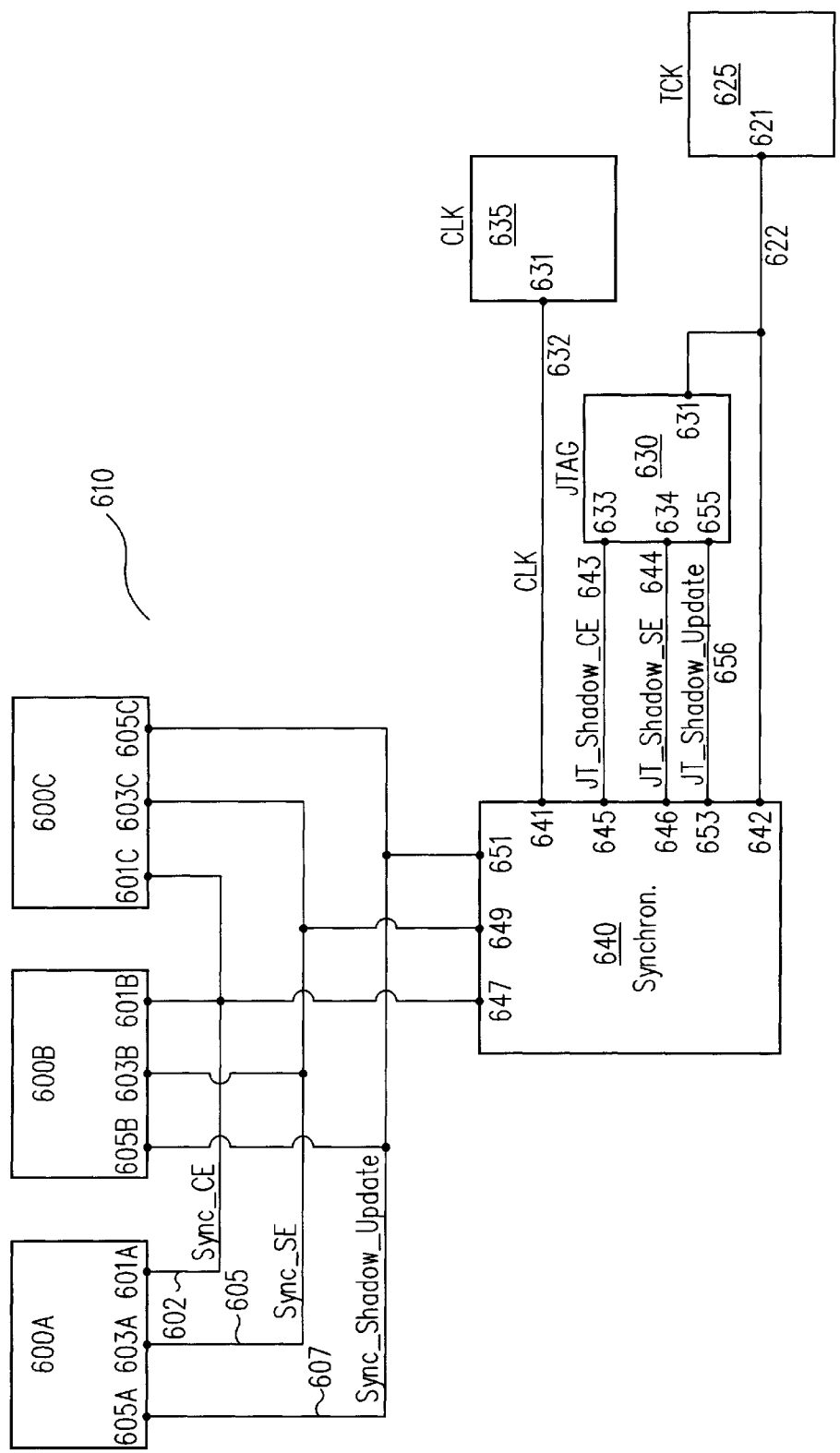
FIG. 6A is a block diagram of a system consistent with the present invention including functional units that are impedance controller circuits in accordance with the principles of the invention.

FIG. 6A is a block diagram of a system 610 consistent with the present invention, which is used with impedance controller circuits. System 610 includes: a system or central processing unit "CPU" clock, referred to herein as "CLK 635"; a JTAG clock, referred to herein as "TCK 625"; a JTAG controller 630; a block of one or more synchronizer circuits, referred to herein as "synchronizer 640"; and impedance control circuits 600A, 600B and 600C.

In one embodiment of the invention, impedance control circuits 600A, 600B and 600C are designed in accordance with the circuits disclosed in commonly assigned U.S. Pat. No. 6,060,907, entitled "IMPEDANCE CONTROL CIRCUIT", filed Jun., 25, 1997, issued May 9, 2000, listing Vishwanthaiah et al. as inventors and which is incorporated by reference herein, in its entirety, for all purposes.

As shown in FIG. 6A, CLK 635 has an output terminal 631 coupled to CLK input terminal 641 of synchronizer 640 by line 632. TCK 625 has an output terminal 621 coupled to input terminal 631 of JTAG controller 630 by line 622 and input terminal 642 of synchronizer 640 by line 622.

In addition, according to the invention, JTAG controller 630 has a shadow_ce output terminal 633 coupled to a shadow_ce input terminal 645 of synchronizer 640 by line 643. According to the invention, JTAG controller 630 also has a shadow_se output terminal 634 coupled to a shadow_se input terminal 646 of synchronizer 640 by line 644. According to the invention, JTAG controller 630 also has a shadow_update output terminal 655 coupled to a shadow_update input terminal 653 of synchronizer 640 by line 656. JTAG controller shadow_ce output terminal 633, synchronizer shadow_ce input terminal 645, JTAG controller shadow_se output terminal 634, synchronizer shadow_se input terminal 646, as well as the signals jt_shadow_ce and jt_shadow_se generated on lines 643 and 644, are discussed in more detail above with respect to system 10 of FIG. 1B and system 10A in FIG. 2 and they operate in essentially the same manner in system 610. JTAG controller shadow_output terminal 655, synchronizer 640 shadow_input terminal 653, and the signal jt_shadow_on line 656 are used to write known values back into the shadowed functional registers of impedance controller circuits 600A, 600B, and 600C as discussed in more detail below.

As also shown in FIG. 6A, synchronizer 640 includes a sync_ce output terminal 647, a sync_se output terminal 649 and a shadow_update output terminal 651. Synchronizer 640 sync_ce output terminal 647 is coupled to: sync_ce input terminal 601A of impedance control circuit 600A; sync_ce input terminal 601B of impedance control circuit 600B; and sync_ce input terminal 601C of impedance control circuit 600C by line 602. Synchronizer 640 sync_se output terminal 649 is coupled to: sync_se input terminal 603A of impedance control circuit 600A; sync_se input terminal 603B of impedance control circuit 600B; and sync_se input terminal 603C of impedance control circuit 600C by line 605. Synchronizer 640 shadow_update output terminal 651 is coupled to: shadow_update input terminal 605A of impedance control circuit 600A; shadow_update input terminal 605B of impedance control circuit 600B; and shadow_update input terminal 605C of impedance control circuit 600C by line 607.

Synchronizer 640 sync_ce output terminal 647; synchronizer sync_se output terminal 649, as well as signals sync_ce and sync_se on lines 602 and 605 were discussed in detail above with respect to system 10 of FIG. 1B and system 100A in FIG. 2 and they operate in essentially the same manner in system 610. Synchronizer 640 shadow_output terminal 651 and signal sync_shadow_update on line 607 are used to write known values back into the shadowed functional registers of impedance controller circuits 600A, 600B, and 600C as discussed in more detail below.

As discussed above, in one embodiment of the invention, impedance control circuits 600A, 600B and 600C are designed in accordance with the circuits disclosed in commonly assigned U.S. Pat. No. 6,060,907. It should also be noted here that for simplicity only three impedance control circuits 600A, 600B and 600C are shown in FIG. 6A. However, those of skill in the art will recognize that any number of impedance control circuits 600A, 600B and 600C desired can be accommodated using the method of the invention.

CLK 635 is one of numerous system clocks well known in the art that can have virtually infinite frequencies ranging, at the time of this application, from megahertz to multi-gigahertz. As mentioned, system clocks, such as CLK 635, are well known in the art and therefore will not be discussed in further detail herein to avoid detracting from the present invention.

TCK 625 is the external clock required by the JTAG standard and is well known to those of skill in the art. TCK 625 typically operates at a frequency that is much lower than CLK 635. For instance, as one example, CLK 635 may operate at a frequency of one gigahertz while TCK 625 operates at a frequency of ten megahertz. As with CLK 635, TCK 625 is well known in the art and therefore will not be discussed in further detail in order to avoid detracting from the present invention.

JTAG controller 630 is well defined in IEEE STD. 1149.1 and issues signals to either shadowed functional registers or shadow storage elements of impedance control circuits 600A, 600B and 600C via synchronizer 640 (FIG. 6A). These signals may include a Scan In (si) signal, a scan enable (se) signal, or a clock-enable (ce) signal, respectively.

In addition, according to the present invention, JTAG controller 630 issues command signals, jt_shadow_ce, jt_shadow_se and jt_shadow_update to shadow storage scans paths of impedance control circuits 600A, 600B and 600C through synchronizer 640 (FIG. 6A).

JTAG controller 630 and it's normal operation is well known to those of skill in the art and therefore will not be discussed in further detail herein order to avoid detracting from the present invention. Special command signals jt_shadow_ce, jt_shadow_se and jt_shadow_update associated with the present invention are discussed in detail above with respect to system 10 of FIG. 1B and system 10A in FIG. 2 and they operate in essentially the same manner in system 610.

As discussed above, CLK 635 and TCK 625 operate at different frequencies and often this difference in frequency is an order of magnitude or more. As also discussed above, this situation creates a need to synchronize the external clock signal from TCK 625 used to drive the shadow storage elements in the shadow scan path with the system clock signal from CLK 635 (FIG. 6A) used by the circuit's shadowed functional registers and to control skewing of the external clock signal from TCK 625 (FIG. 6A).

This function is performed by Synchronizer 640 in FIG. 6A. As discussed above, in one embodiment of the invention, synchronizer 640 is of the type set forth in the commonly assigned patent application Ser. No. 09/204,557 of Arthur T. Leung and Dale Greenley entitled "METHODS AND APPARATUS FOR SYNCHRONIZING ASYNCHRONOUS TEST STRUCTURES AND ELIMINATING CLOCK SKEW CONSIDERATIONS" filed Dec. 3, 1998 which is incorporated herein, in it's entirety, by reference.

Figure 6B:
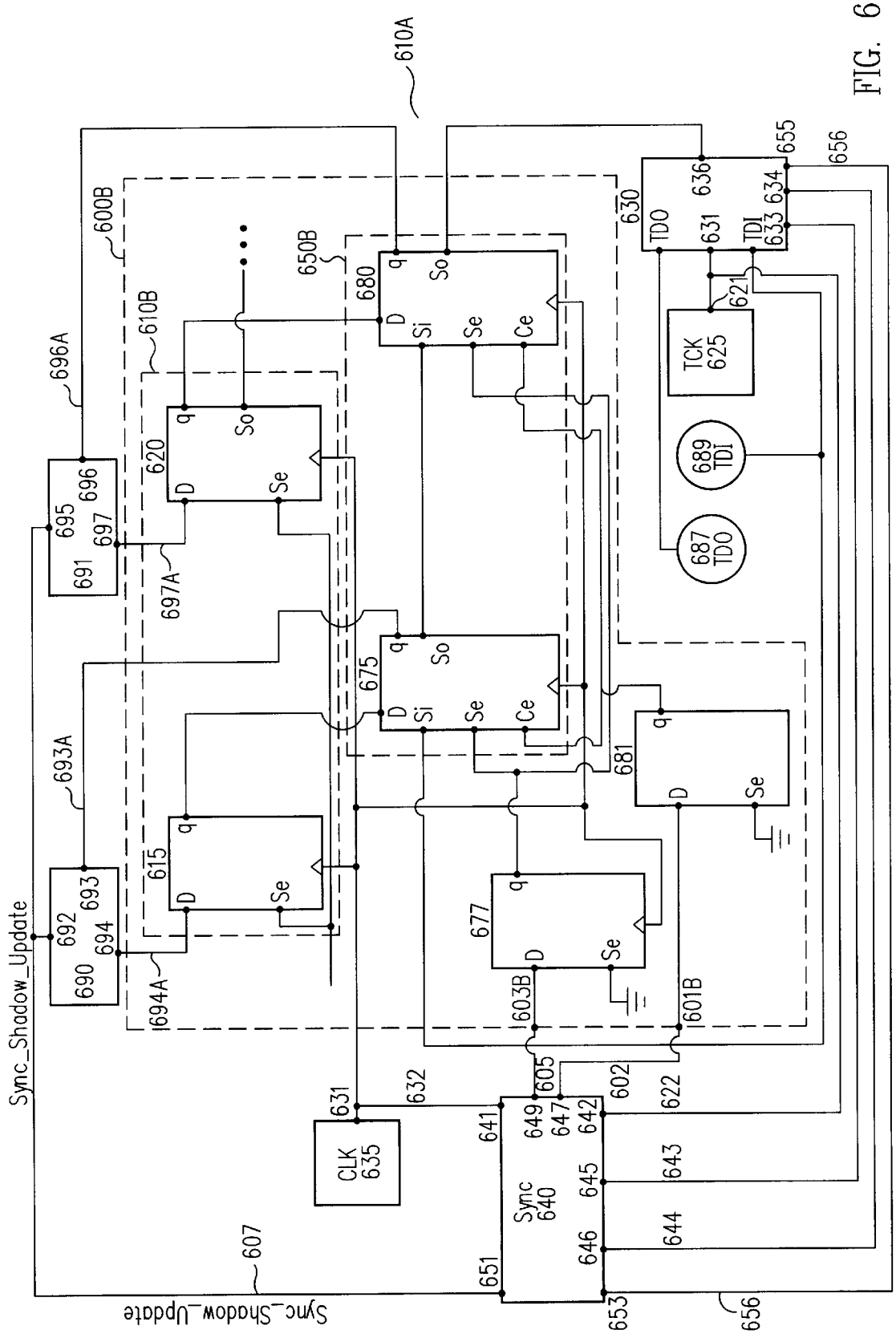
FIG. 6B is a block diagram depicting a system consistent with the method of the invention, similar to the system of FIG. 6A, in more detail.

FIG. 6B is a block diagram depicting a system 610A that is consistent with the invention and the Leung reference.

System 610A comprises: exemplary impedance control circuit 600B from FIG. 6A with primary scan path 610B and a shadow scan path 650B; synchronizer 640; CLK 635; TCK 625; Test Data In (TDI) unit 689; Test Data Out (TDO) unit 687 and JTAG controller 630. In one embodiment of the invention, primary scan path 610B of impedance control circuit 600B comprises primary storage elements 615 and 620 and shadow scan path 650B of impedance control circuit 600B comprises shadow storage elements 675 and 680, as well as shadow staging elements 677 and 681. As with system 610 in FIG. 6A, system 610A is interfaced to CLK 635 and JTAG controller 630.

In the following discussion, impedance control circuit 600B of FIG. 6A was chosen to discuss. However, those of skill in the art will recognize that impedance control circuits 600A or 600C of FIG. 6A, or any impedance control circuit, could have been chosen for discussion. impedance control circuit 600B was simply chosen as an exemplary functional unit and the implementation of the invention in any other impedance control circuit would be substantially the same as discussed below.

As discussed above with regard to FIG. 6A, primary storage elements 615 and 620 store data used by the circuit core logic and shadow storage elements 675 and 680 store data either from primary storage elements 615, 620 or from a preceding shadow storage element in the chain. In one embodiment of the invention, primary storage elements 615 and 620 are edge-triggered flip-flops with a data input ("d") and a clock input ("CK"), such as D-type flip-flops. In one embodiment of the invention, shadow storage elements 675 and 680 are edge-triggered flip-flops with two data inputs, a Select ("se") input, a clock-enable ("CE") input, and a clock input ("CK"), such as mux-2 D-type flip flops with clock enable.

As also discussed above with respect to FIG. 6A, shadow storage elements 675, 680 receive data from primary storage elements 615, 620 via "d" inputs and receive data from preceding shadow storage elements via "si" inputs.

In one embodiment of the invention, terminal TDI of JTAG controller 630 is connected to Test Data In unit 689 and si input of shadow storage element 675. Terminal TDO of JTAG controller 630 is connected to Test Data Out unit 687. As in the embodiment of the invention discussed above with respect to FIG. 6A, JTAG controller 630 has a shadow_ce output terminal 633 coupled to a shadow_ce input terminal 645 of synchronizer 640 by line 643. JTAG controller 630 also has a shadow_se output terminal 634 coupled to a shadow_se input terminal 646 of synchronizer 640 by line 644.

Synchronizer 640 includes a sync_ce output terminal 647 and a sync_se output terminal 649. Synchronizer 640 sync_ce output terminal 647 is coupled to sync_ce input terminal 601B of impedance control circuit 600B by line 602. In one embodiment of the invention, input terminal 601B of impedance control circuit 600B is coupled to a "d" input terminal of shadow staging element 681. Synchronizer 640 sync_se output terminal 649 is coupled to sync_se input terminal 603B of impedance control circuit 600B by line 605. In one embodiment of the invention, input terminal 603B of impedance control circuit 600B is coupled to a "d" input terminal of shadow staging element 677.

As also shown in FIG. 6B, in one embodiment of the invention, CLK 635 has an output terminal 631 coupled to CLK input terminal 641 of synchronizer 640 by line 632. TCK 625 has an output terminal 621 coupled to input terminal 631 of JTAG controller 630 by line 622 and input terminal 642 of synchronizer 640 by line 622.

In one embodiment of the invention, the "d" inputs of shadow storage elements 675 and 680, respectively, are coupled to the "q" data outputs of primary storage elements 615 and 620, respectively, and the "si" 1 input of shadow storage element 680 is coupled to the "so" data output of shadow storage element 675 to form shadow scan path 650B. The "so" data output of the last shadow storage element in shadow scan path 650B, i.e., output "so" of shadow storage element 680 in FIG. 6B, is coupled to JTAG controller 630 at terminal 636.

In one embodiment of the invention, CLK 635 is coupled to the clock inputs of primary storage elements 615 and 620, respectively, and the clock inputs of shadow storage elements 675 and 680, respectively.

In one embodiment of the invention, a "q" output terminal of shadow staging element 677 is coupled to the se input terminal of shadow storage element 675 and se input terminal of shadow storage element 680. A "q" output terminal of shadow staging element 681 is coupled to the ce input terminal of shadow storage element 675 and ce input terminal of shadow storage element 680.

As discussed above, JTAG controller 630 is well defined in the JTAG standard and issues commands to either primary storage elements 615, 620 or shadow storage elements 675, 680 via synchronizer 640. These commands include a Scan In (si) signal, a Select Enable (se) signal, or a Clock Enable (ce) signal, respectively.

In addition, according to the present invention, special customized command signals jt_shadow_ce and jt_shadow_se are generated by JTAG controller 630. As discussed above, signal jt_shadow_ce is coupled from output terminal 633 of JTAG controller 630 to input terminal 645 of synchronizer 640 by line 643 and signal jt_shadow_se is coupled from output terminal 634 of JTAG controller 630 to input terminal 646 of synchronizer 640 by line 644. Signals sync_se and sync_ce are then generated by synchronizer 640 at output terminals 649 and 647, respectively.

As discussed above, in one embodiment of the invention, output terminal 647 from synchronizer 640 is coupled to the data "d" input of shadow staging element 681 and output terminal 649 from synchronizer 640 is coupled to the data "d" input of shadow staging element 677.

As discussed above, CLK 635 outputs a skew-controlled clock signal that is used by many components of the system, such as the logic elements of the core logic. Synchronizer 640 receives inputs from CLK 635 and JTAG controller 630, and provides output signals sync_se and sync_ce that are synchronized to CLK 635 and operate at the frequency of the signal from JTAG controller 630.

According to the invention, JTAG controller 630 also has a shadow_output terminal 655 coupled to a shadow_input terminal 653 of synchronizer 640 by line 656. As also shown in FIG. 6B, synchronizer 640 includes a shadow_update output terminal 651. Synchronizer 640 shadow_update output terminal 651 is coupled to: shadow_update input terminal 692 of shadow scan/functional block 690 and shadow_input terminal 695 of shadow scan/functional block 691 by line 607. Synchronizer 640 shadow_update output terminal 651 and signal sync_shadow_on line 607 are used to write known values back into the shadowed functional registers of impedance controller circuit 600B.

Shadow scan/functional block 690 includes shadow_update output terminal 694 coupled to the "d" input of primary storage element 615 by line 694A and terminal 693 coupled to the "q" output of shadow storage element 675 by line 693A. Shadow scan/functional block 691 includes shadow_output terminal 697 coupled to the "d" input of primary storage element 620 by line 697A and terminal 696 coupled to the "q" output of shadow storage element 680 by line 696A.

JTAG controller 630 shadow_update output terminal 655, synchronizer 640 shadow_update input terminal 653, the signal jt_shadow_update on line 656, shadow scan/functional block 690 and shadow scan/functional block 691 are used to write known values back into the shadowed functional registers of impedance controller circuit 600B as discussed in more detail below.

Figure 7A:
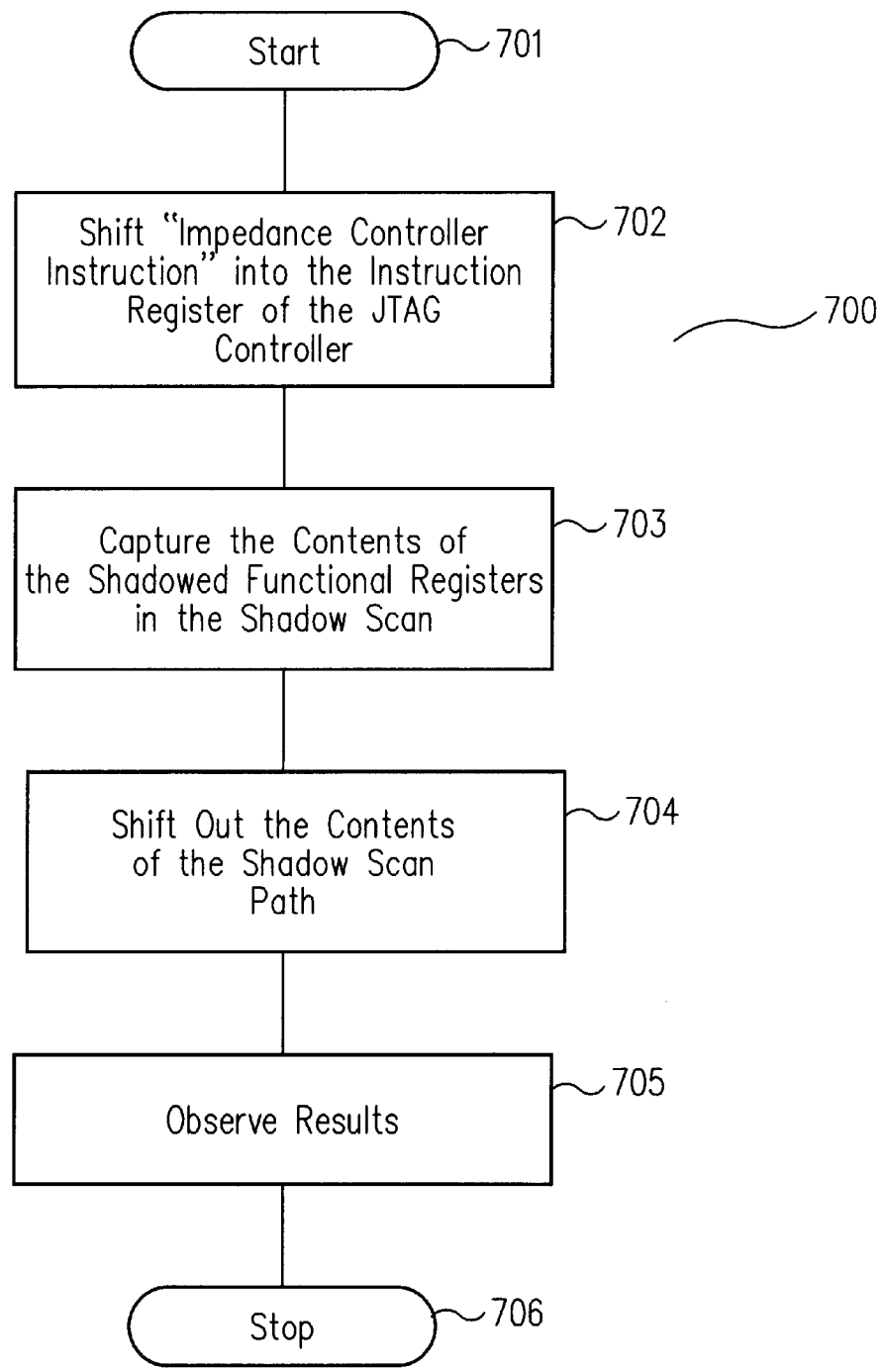
FIG. 7A is a flow diagram of one embodiment of the method of the invention where the data in the shadowed functional registers of an impedance controller circuit is shifted out for observation using an impedance controller circuit shadow scan path.

FIG. 7A is a flow diagram of one embodiment of a method 700 of the invention where the data in the shadowed functional registers of an impedance controller circuit is shifted out, or captured, for observation using an impedance controller circuit shadow scan path.

As seen in FIG. 7A, method 700 starts at 701 and at 702, a custom JTAG op-code defined as the "Impedance Controller Instruction" is shifted into the instruction register of JTAG controller 630 (FIG. 6). In this instance, the data register (DR) becomes the impedance controller circuit shadow scan path. The impedance controller instruction is activated by passing through the update instruction register operation of the JTAG controller.

At 703, the contents of the impedance controller circuit shadowed functional registers are shifted into the impedance controller circuit shadow scan path and thereby captured according to the method of the invention discussed in detail above.

At 704, the contents of the impedance controller circuit shadow scan path are shifted out. In one embodiment, the contents of the impedance controller circuit shadow scan path are shifted out via a test data out (TDO) terminal and, at 705, the results are available for observation. The method ends at 706, or is repeated.

Just as was the case with systems 10 and 10A discussed above, method 700 shown in FIG. 7A, and discussed above, allows for access to the internal states of impedance controller circuits 600A, 600B and 600C (FIG. 6) to test impedance controller circuits 600A, 600B and 600C while impedance controller circuits 600A, 600B and 600C, and the parent microprocessor, continue to operate in a system. This is accomplished by capturing the contents of impedance controller circuits 600A, 600B and 600C primary storage elements into the shadow storage elements and then shifting the captured value out without interrupting normal circuit operation. Therefore, system 610, and method 700 shown in FIG. 7A, has all the advantages discussed above with respect to systems 10 and 10A.

Figure 7B:
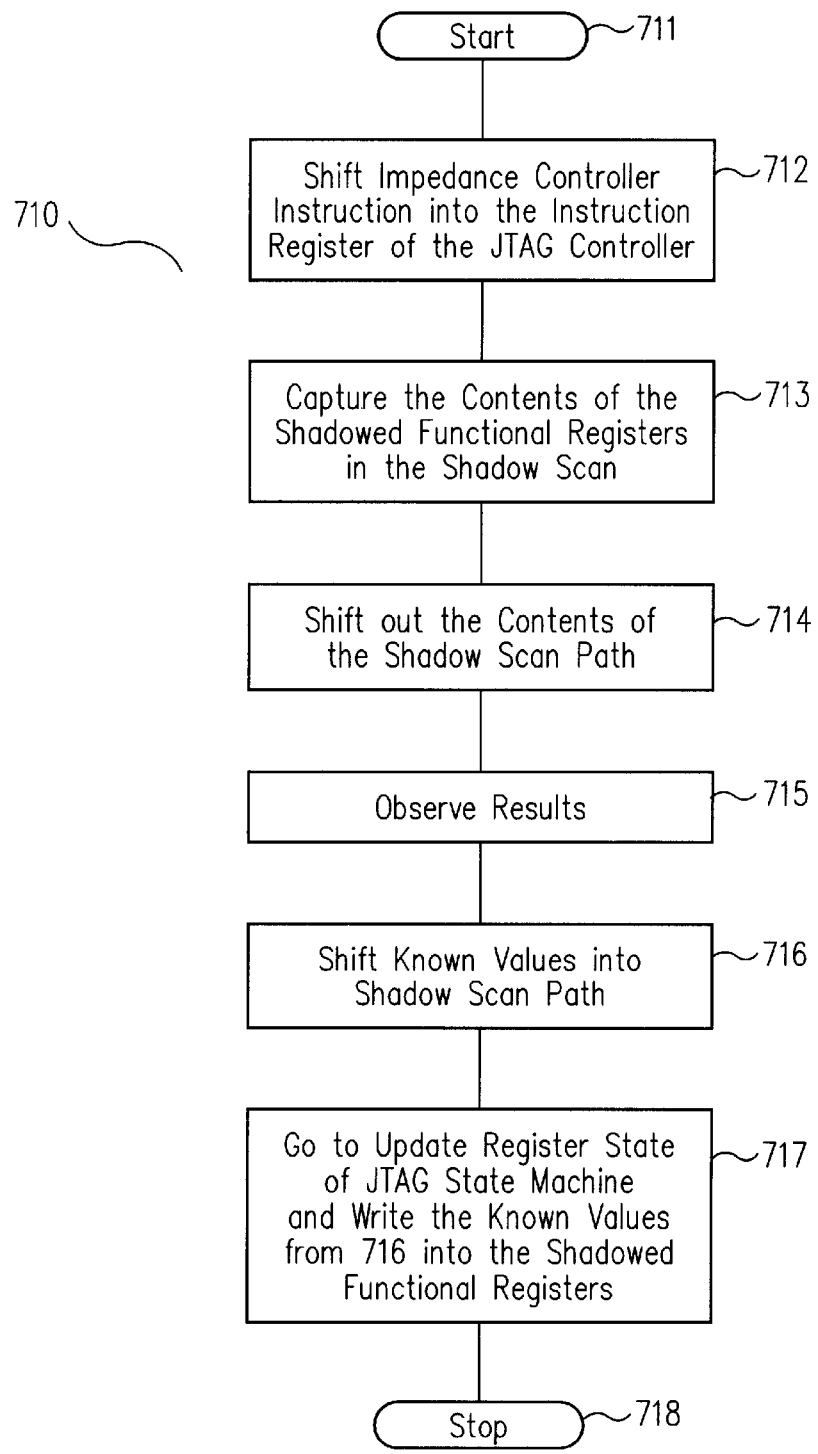
FIG. 7B is a is a flow diagram of one embodiment of the method of the invention where the data in the shadowed functional registers of an impedance controller circuit is shifted out using an impedance controller circuit shadow scan path and then known values are written back into the impedance controller circuit primary scan path using the impedance controller circuit shadow scan path.

In one embodiment of the invention, known values can be written back into impedance controller circuits 600A, 600B and 600C for testing and debug purposes. FIG. 7B is a flow diagram of one embodiment of a method 710 of the invention where the data in the shadowed functional registers of an impedance controller circuit is shifted out using an impedance controller circuit shadow scan path and then known values are written back into the impedance controller circuit shadowed functional registers.

As seen in FIG. 7B, method 710 starts at 711 and, at 712, a custom JTAG op-code defined as "Impedance Controller Instruction" is shifted into the instruction register of JTAG controller 630 (FIG. 6). In this instance, the data register (DR) becomes the impedance controller circuit shadow scan path. The impedance controller instruction op-code is activated by passing through the update instruction register operation of the JTAG controller.

At 713, the contents of the impedance controller circuit shadowed functional registers are shifted into the impedance controller circuit shadow scan path and thereby captured according to the method of the invention discussed in detail above.

At 714, the contents of the impedance controller circuit shadow scan path are shifted out. In one embodiment, the contents of the impedance controller circuit shadow scan path are shifted out via a test data out (TDO) terminal.

At 715, the results are available for observation.

According to method 710, known values are then shifted into the impedance controller circuit shadow scan path at 716. In one embodiment, known values are shifted into the impedance controller circuit shadow scan path using a test data in (TDI) terminal.

Once the known values are shifted into the impedance controller circuit shadow scan path, at 717, on the next update of the data register state of the JTAG controller state machine, the known values in the shadow registers, i.e., the known values from 716, are written back into the impedance controller circuit shadowed functional registers.

The method ends at 718, or is repeated.

Method 710 shown in FIG. 7B, and discussed above, allows for access to the internal states of impedance controller circuits 600A, 600B and 600C (FIG. 6) to test impedance controller circuits 600A, 600B and 600C while impedance controller circuits 600A, 600B and 600C, and the parent microprocessor, continue to operate in a system. In addition, method 710 shown in FIG. 7B provides for known values to be written back into the impedance controller circuit shadowed functional registers for testing and debug of impedance controller circuits 600A, 600B and 600C in controlled conditions.

Figure 7C:
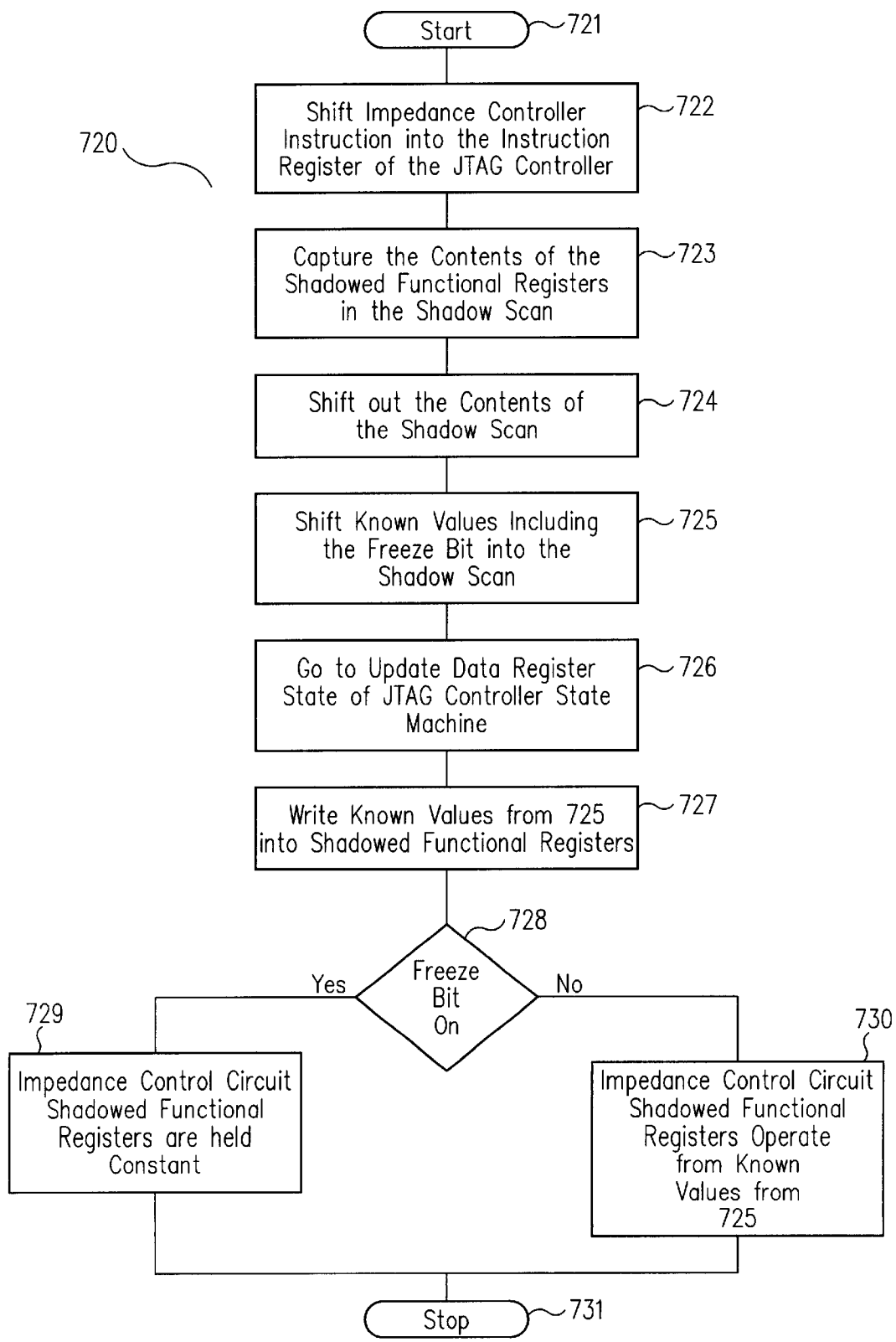
FIG. 7C is a flow diagram of one embodiment of the method of the invention where the data in the shadowed functional registers of an impedance controller circuit is shifted out using an impedance controller circuit shadow scan path and then known values are written back into the impedance controller circuit shadowed functional registers using the impedance controller circuit shadow scan path while data in the impedance controller circuit registers is held constant or "frozen".

FIG. 7C is a is a flow diagram of one embodiment of a method 720 of the invention where the data in the shadowed functional registers of an impedance controller circuit is shifted out using an impedance controller circuit shadow scan path. Then known values are written back into the impedance controller circuit shadowed functional registers using the impedance controller circuit shadow scan path and the data in the impedance controller circuit registers can be kept constant, or frozen.

As seen in FIG. 7C, method 720 starts at 721 and, at 722, a custom JTAG op-code defined as the "Impedance Controller Instruction" is shifted into the instruction register of JTAG controller 630 (FIG. 6). In this instance the data register (DR) becomes the impedance controller circuit shadow scan path. The impedance controller instruction is activated by passing through the update instruction register operation of the JTAG controller.

At 723, the contents of the impedance controller circuit shadowed functional registers are captured into the impedance controller circuit shadow scan path and thereby captured according to the methods of the invention discussed in detail above.

At 724, the contents of the impedance controller circuit shadow scan path are shifted out. In one embodiment, the contents of the impedance controller circuit shadow scan path are shifted out via a test data out (TDO) terminal.

According to method 720, known values, including a freeze bit, are then shifted into the impedance controller circuit shadow scan path at 725.

Once the known values, including the freeze bit, are shifted into the impedance controller circuit shadow scan path, at 726, the method goes to the next update of the data register state of the JTAG controller state machine.

At 727, the known values, including the freeze bit, in the shadow registers, i.e., the known values, including the freeze bit, from 725, are written back into the impedance controller circuit shadowed functional registers.

At 728, a determination is made regarding the state of the freeze bit. If the freeze bit is enabled, i.e., the freeze bit is on, then, at 729, the impedance controller circuits shadowed functional registers are held constant at the known values. If, on the other hand, the freeze bit is disabled, i.e., the freeze bit is off, then, at 730, the impedance controller circuits shadowed functional registers operate normally starting from the known values of 725.

At 731, the process ends or is repeated.

Method 720 shown in FIG. 7C, and discussed above, allows for access to the internal states of impedance controller circuits 600A, 600B and 600C (FIG. 6) to test impedance controller circuits 600A, 600B and 600C while impedance controller circuits 600A, 600B and 600C, and the parent microprocessor, continue to operate in a system. In addition, method 720 shown in FIG. 7C provides for known values to be written back into the impedance controller circuit shadowed functional registers and those values to be either held frozen for testing and debug of impedance controller circuits 600A, 600B and 600C in known and static artificial conditions or to operate normally from a known starting state.

As shown above, the method of the present invention allows for access to the internal states of the microprocessor to debug the microprocessor while the microprocessor continues to operate in a system. This is accomplished by capturing the contents of the functional primary storage elements into the shadow storage elements and then shifting the captured value out of the microprocessor without interrupting normal circuit operation. This is in direct contrast to prior art methods, which either tested only at the boundaries, i.e., at the inputs and outputs of the microprocessor, or that, required the microprocessor to run in a special test mode. In addition, using the method of the invention, real operating data is obtained from the microprocessor. This is also in direct contrast to the prior art methods where only data from special test mode operation could be obtained. Consequently, using the method of the invention, more accurate and realistic test data is provided.

As shown above, the method of the present invention uses the JTAG standard and takes advantage of the separate JTAG clock (TCK) to manipulate the capture and shift operations of the shadow scan path using specially designed JTAG signals. In addition, using the method and structure of the invention, the shadow scan paths are not part of the microprocessor internal scan chain.

This Application is related to: U.S. Pat. No. 6,060,907, filed Jun. 25, 1997, issued May 9, 2000 entitled "IMPEDANCE CONTROL CIRCUIT", and naming Sai V. Vishwanthaiah, Jonathan Starr and Alexander D. Taylor as inventors; U.S. patent application Ser. No. 09/680,238, filed Oct. 05, 2000, entitled "APPARATUS FOR ON-LINE CIRCUIT DEBUG USING JTAG AND SHADOW SCAN IN A MICROPROCESSOR", and naming Farideh Golshan as inventor; U.S. patent application Ser. No. 09/680,237, filed Oct. 05, 2000, entitled "METHOD FOR ON-LINE CIRCUIT DEBUG USING JTAG AND SHADOW SCAN IN A MICROPROCESSOR", and naming Farideh Golshan as inventor, all of which are assigned to the assignee of the present invention and are incorporated herein, in their entirety, by reference for all purposes.

The foregoing description of an implementation of the invention has been presented for purposes of illustration and description, and therefore is not exhaustive and does not limit the invention to the precise form disclosed. Modifications and variations are possible in light of the above teachings or may be acquired from practicing the invention. For example, the description above is based on the JTAG standard, but it may be used with other standards. The scope of the invention is defined by the claims and their equivalents.

What is claimed is:

1. A method for testing a circuit having at least one functional unit, said method comprising:

providing said functional unit with a primary scan path comprising at least two primary storage elements that are flip-flops each having a primary storage element "d" input, a primary storage element "si" input, a primary storage element "q" output and a primary storage element "so" output; and providing said functional unit with a shadow scan path comprising at least two shadow storage elements that are flip-flops each having a shadow storage element "d" input, a shadow storage element "si" input and a shadow storage element "so" output, wherein;

a first primary storage element of said at least two primary storage elements has a first primary storage element "q" output coupled to a first shadow storage element "d" input of a first shadow storage element of said at least two shadow storage elements and a second primary storage element of said at least two primary storage elements has a second primary storage element "q" output coupled to a second shadow storage element "d" input of a second shadow storage element of said at least two shadow storage elements;

a first primary storage element "so" output of said first primary storage element is coupled to a second primary storage element "si" input of said second primary storage element thereby forming said primary scan path; and a first shadow storage element "so" output of said first shadow storage element is coupled to a second shadow storage element "si" input of said second shadow storage element thereby forming said shadow scan path;

shifting data contained in said primary scan path into said shadow scan path; and shifting said data in said shadow scan path out of said functional unit for testing the operation of said circuit while said circuit continues its normal operations.

2. A method for testing a processor having at least one functional unit using the JTAG standard, said method comprising:

providing a synchronizer to said processor, said synchronizer generating a signal "sync_ce" at a synchronizer first output terminal and a signal "sync_se" at a synchronizer second output terminal, said synchronizer having a synchronizer first input terminal, a synchronizer second input terminal; a synchronizer third input terminal and a synchronizer fourth input terminal;

providing a system clock to said processor, said system clock generating a signal "CLK" with a first frequency at a system clock first output terminal, said system clock first output terminal being coupled to said synchronizer third input terminal;

providing a JTAG controller to said processor, said JTAG controller having a JTAG controller first input terminal, said JTAG controller generating a signal "jt_shadow_cell" at a JTAG controller first output terminal and a signal "jt_shadow_se" at a JTAG controller second output terminal, said JTAG controller first output terminal being coupled to said synchronizer first input terminal and said JTAG controller second output terminal being coupled to said synchronizer second input terminal;

providing a JTAG clock to said processor, said JTAG clock generating a signal "TCK" with a second frequency at a JTAG clock first output terminal, said JTAG clock first output terminal being coupled to said synchronizer fourth input terminal;

providing said at least one functional unit with a functional unit first input terminal and a functional unit second input terminal;

coupling said synchronizer first output terminal to said functional unit first input terminal;

coupling said synchronizer second output terminal to said functional unit second input terminal;

providing said functional unit with a primary scan path comprising at least two primary storage elements that are flip-flops each having a primary storage element "d" input, a primary storage element "si" input, a primary storage element "q" output and a primary storage element "so" output; and providing said functional unit with a shadow scan path comprising at least two shadow storage elements that are flip-flops each having a shadow storage element "d" input, a shadow storage element "si" input and a shadow storage element "so" output, wherein;

a first primary storage element of said at least two primary storage elements has a first primary storage element "q" output coupled to a first shadow storage element "d" input of a first shadow storage element of said at least two shadow storage elements and a second primary storage element of said at least two primary storage elements has a second primary storage element "q" output coupled to a second shadow storage element "d" input of a second shadow storage element of said at least two shadow storage elements;

a first primary storage element "so" output of said first primary storage element is coupled to a second primary storage element "si" input of said second primary storage element thereby forming said primary scan path; and a first shadow storage element "so" output of said first shadow storage element is coupled to a second shadow storage element "si" input of said second shadow storage element thereby forming said shadow scan path, further wherein;

in response to said signals sync_ce and sync_se from said synchronizer, said shadow scan path receives data contained in said primary scan path and shifts said data out of said functional unit for testing the operation of said processor while said processor continues its normal operations.

3. A circuit having at least one functional unit, said circuit comprising:

a functional unit, said functional unit comprising;

a primary scan path comprising at least two primary storage elements that are flip-flops each having a primary storage element "d" input, a primary storage element "si" input, a primary storage element "q" output and a primary storage element "so" output; and a shadow scan path comprising at least two shadow storage elements that are flip-flops each having a shadow storage element "d" input, a shadow storage element "si" input and a shadow storage element "so" output, wherein;

a first primary storage element of said at least two primary storage elements has a first primary storage element "q" output coupled to a first shadow storage element "d" input of a first shadow storage element of said at least two shadow storage elements and a second primary storage element of said at least two primary storage elements has a second primary storage element "q" output coupled to a second shadow storage element "d" input of a second shadow storage element of said at least two shadow storage elements;

a first primary storage element "so" output of said first primary storage element is coupled to a second primary storage element "si" input of said second primary storage element thereby forming said primary scan path; and a first shadow storage element "so" output of said first shadow storage element is coupled to a second shadow storage element "si" input of said second shadow storage element thereby forming said shadow scan path, further wherein;

data contained in said primary scan path is shifted into said shadow scan path; and said data in said shadow scan path is shifted out of said functional unit for testing the operation of said circuit while said circuit continues its normal operations.

4. A system having at least one functional unit said system comprising:

a synchronizer, said synchronizer generating a signal "sync_ce" at a synchronizer first output terminal and a signal "sync_se" at a synchronizer second output terminal, said synchronizer having a synchronizer first input terminal, a synchronizer second input terminal; a synchronizer third input terminal and a synchronizer fourth input terminal;

a system clock, said system clock generating a signal "CLK" with a first frequency at a system clock first output terminal, said system clock first output terminal being coupled to said synchronizer third input terminal;

a JTAG controller, said JTAG controller having a JTAG controller first input terminal, said JTAG controller generating a signal "jt_shadow_ce" at a JTAG controller first output terminal and a signal "jt_shadow_se" at a JTAG controller second output terminal, said JTAG controller first output terminal being coupled to said synchronizer first input terminal and said JTAG controller second output terminal being coupled to said synchronizer second input terminal;

a JTAG clock, said JTAG clock generating a signal "TCK" with a second frequency at a JTAG clock first output terminal, said JTAG clock first output terminal being coupled to said synchronizer fourth input terminal;

at least one functional unit with a functional unit first input terminal and a functional unit second input terminal, wherein;

said synchronizer first output terminal is coupled to said functional unit first input terminal;

said synchronizer second output terminal is coupled to said functional unit second input terminal;

said functional unit comprising a primary scan path with at least two primary storage elements that are flip-flops each having a primary storage element "d" input, a primary storage element "si" input, a primary storage element "q" output and a primary storage element "so" output; and said functional unit further comprising a shadow scan path comprising at least two shadow storage elements that are flip-flops each having a shadow storage element "d" input, a shadow storage element "si" input and a shadow storage element "so" output, further wherein;

a first primary storage element of said at least two primary storage elements has a first primary storage element "q" output coupled to a first shadow storage element "d" input of a first shadow storage element of said at least two shadow storage elements and a second primary storage element of said at least two primary storage elements has a second primary storage element "q" output coupled to a second shadow storage element "d" input of a second shadow storage element of said at least two shadow storage elements;

a first primary storage element "so" output of said first primary storage element is coupled to a second primary storage element "si" input of said second primary storage element thereby forming said primary scan path; and a first shadow storage element "so" output of said first shadow storage element is coupled to a second shadow storage element "si" input of said second shadow storage element thereby forming said shadow scan path, further wherein;

in response to said signals sync_ce and sync_se from said synchronizer, said shadow scan path receives data contained in said primary scan path and shifts said data out of said functional unit for testing the operation of said processor while said processor continues its normal operations.

5. A processor having at least one functional unit comprising:

a synchronizer means, said synchronizer means generating a signal "sync_ce" at a synchronizer means first output terminal and a signal "sync_se" at a synchronizer means second output terminal, said synchronizer means having a synchronizer means first input terminal, a synchronizer means second input terminal; a synchronizer means third input terminal and a synchronizer means fourth input terminal;

a system clock means, said system clock means generating a signal "CLK" with a first frequency at a system clock means first output terminal, said system clock means first output terminal being coupled to said synchronizer means third input terminal;

a JTAG controller means, said JTAG controller means having a JTAG controller means first input terminal, said JTAG controller means generating a signal "jt_shadow_ce" at a JTAG controller means first output terminal and a signal "jt_shadow_se" at a JTAG controller means second output terminal, said JTAG controller means first output terminal being coupled to said synchronizer means first input terminal and said JTAG controller means second output terminal being coupled to said synchronizer means second input terminal;

a JTAG clock means, said JTAG clock means generating a signal "TCK" with a second frequency at a JTAG clock means first output terminal, said JTAG clock means first output terminal being coupled to said synchronizer means fourth input terminal;

at least one functional unit means with a functional unit means first input terminal and a functional unit means second input terminal, said functional unit means comprising a primary scan path means and a shadow scan path means, wherein;

said synchronizer means first output terminal is coupled to said functional unit means first input terminal and said synchronizer means second output terminal is coupled to said functional unit means second input terminal, further wherein;

in response to said signals sync_ce and sync_se from said synchronizer means, said shadow scan path means receives data contained in said primary scan path means and shifts said data out of said functional unit means for testing the operation of said processor while said processor continues its normal operations.

* * * * *